(12) United States Patent
Auzanneau et al.

(10) Patent No.: US 9,995,814 B2
(45) Date of Patent: Jun. 12, 2018

(54) METHOD FOR COMPENSATING FOR PROPAGATION INHOMOGENEITIES FOR A TEMPORAL REFLECTOMETRY SIGNAL

(71) Applicant: COMMISSARIAT A L'ENERGIE ATOMIQUE ET AUX ENERGIES ALTERNATIVES, Paris (FR)

(72) Inventors: Fabrice Auzanneau, Massy (FR); Lola El Sahmarany, Cachan (FR); Luca Incarbone, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 233 days.

(21) Appl. No.: 14/787,743

(22) PCT Filed: Apr. 24, 2014

(86) PCT No.: PCT/EP2014/058312
§ 371 (c)(1),
(2) Date: Oct. 28, 2015

(87) PCT Pub. No.: WO2014/180663
PCT Pub. Date: Nov. 13, 2014

(65) Prior Publication Data
US 2016/0109549 A1      Apr. 21, 2016

(30) Foreign Application Priority Data

May 7, 2013    (FR) ...................................... 13 54159

(51) Int. Cl.
*G01R 31/11*    (2006.01)
*G01R 35/00*    (2006.01)

(52) U.S. Cl.
CPC .............. *G01R 35/00* (2013.01); *G01R 31/11* (2013.01)

(58) Field of Classification Search
CPC ................................. G01R 31/11; G01R 35/00
See application file for complete search history.

(56) References Cited

U.S. PATENT DOCUMENTS

| 4,538,103 A | 8/1985 | Cappon |
| 5,083,086 A | 1/1992 | Steiner |
| 2004/0073395 A1 | 4/2004 | Furse et al. |

(Continued)

FOREIGN PATENT DOCUMENTS

| EP | 1 477 820 A2 | 11/2004 |
| FR | 2 987 450 A1 | 8/2013 |
| WO | 2012/032125 A1 | 3/2012 |

*Primary Examiner* — Jermele M Hollington
*Assistant Examiner* — Feba Pothen
(74) *Attorney, Agent, or Firm* — Baker & Hostetler LLP

(57) ABSTRACT

A method for compensating for the propagation inhomogeneities in a time-domain reflectogram measured for a given cable comprises the following steps, executed in an iterative manner: injecting a test signal into the cable, measuring the reflection of the test signal to form a time-domain reflectogram, identifying at least a time portion of the time-domain reflectogram comprising at least one amplitude peak corresponding to a propagation inhomogeneity, subtracting the identified time portion of the reflectogram, divided by the signal reflection coefficient at the injection point, from the test signal, and replacing the test signal with the result of the subtraction.

14 Claims, 3 Drawing Sheets

(56) References Cited

U.S. PATENT DOCUMENTS

| | | |
|---|---|---|
| 2007/0030010 A1 | 2/2007 | Beene |
| 2010/0118999 A1* | 5/2010 | Inagawa ............ H04L 27/2649 375/260 |
| 2013/0173187 A1* | 7/2013 | Sommervogel ...... G01R 31/088 702/58 |
| 2015/0025820 A1 | 1/2015 | Auzanneau et al. |

* cited by examiner

METHOD FOR COMPENSATING FOR PROPAGATION INHOMOGENEITIES FOR A TEMPORAL REFLECTOMETRY SIGNAL

CROSS-REFERENCE TO RELATED APPLICATIONS

This application is a National Stage of International patent application PCT/EP2014/058312, filed on Apr. 24, 2014, which claims priority to foreign French patent application No. FR 1354159, filed on May 7, 2013, the disclosures of which are incorporated by reference in their entirety.

FIELD OF THE INVENTION

The present invention relates to the field of diagnostic systems and methods for cables. More precisely, the invention relates to reflectometry methods for detecting and/or locating faults affecting a cable, particularly time-domain reflectometry methods.

BACKGROUND

The invention proposes a method for compensating for propagation inhomogeneities affecting a time-domain reflectogram which is measured for a given cable by injecting a test signal, called the reflectometry signal, into this cable and then acquiring this signal reflected from any impedance singularities or discontinuities present in the cable.

The invention is applicable to any type of electric cable, particularly power transmission cables or communication cables, in fixed or mobile installations. The cables in question may be coaxial or two-wire, in parallel alignment or twisted pairs, stranded, or other types.

Time-domain reflectometry is a method commonly used in the diagnosis of cables and wired networks. This method consists in injecting a signal into a point-to-point cable or a cable network and then measuring the returned echoes created by reflections of the injected signal from singularities in the cable. The delay and amplitude of these echoes can be used to obtain information on the structure or on the electrical faults present in the cable or cable network, thus enabling a breakdown or, more generally, an electrical fault to be located, characterized, and predicted if necessary.

When a reflectometry system is used, it is frequently found that the measurement of the reflected signal, called a reflectogram, is perturbed by various noise sources.

The common, externally originating, measurement noise, for example that caused by parasitic elements due to the environment of the cable or network, should be distinguished from internally originating noise such as spontaneous fluctuations caused by the discrete nature of phenomena at microscopic level, background noise, thermal noise, and pulsed perturbations. This noise is random in nature and varies stochastically over time.

Another noise, called propagation noise, may also be superimposed on the useful measurement of the reflectogram. This is due to inhomogeneities in the cable, distributed randomly over its length, which cause minor local reflections of the signal and create undesirable small echoes in the reflectogram.

More generally, the measured reflectogram may show undesirable echoes due to these inhomogeneities or to other phenomena such as the reflection of the signal from a junction or branch, a connector, a cable end load or any other device linked to the cable, for example an external device such as a busbar, a cable duct or a cable tray. These echoes may be confused with peaks characteristic of faults which are to be identified by the reflectometry method; they may also mask these echoes because their amplitude is greater than that of the fault peaks being searched for.

The analysis of the reflectogram and the identification of the faults being searched for may therefore be falsified by these undesirable peaks due to the propagation inhomogeneities.

The invention consists in designing an optimal test signal which is specifically adapted to the inhomogeneities present in a cable and which can be used to "clean" the reflectogram. After the injection of this adapted test signal according to the invention, the resulting reflectogram will no longer contain any peak except that which corresponds to the possible impedance mismatch at injection point. The appearance of a fault after the injection of this adapted signal will therefore be very clearly visible, and its location will be greatly facilitated.

It is also possible to generate an adapted signal which results in the measurement of a reflectogram which is not free of all peaks, but has the peaks whose appearance is desirable (if this is of any interest). These peaks may be the peaks that it is desirable to retain, or peaks that can be used to set markers for assistance in subsequent fault location.

SUMMARY OF THE INVENTION

The invention proposes a method for compensating for the propagation inhomogeneities in a time-domain reflectogram measured for a cable, characterized in that it comprises the following steps, executed in an iterative manner:

injecting a test signal into said cable, measuring the reflection of said test signal to form a time-domain reflectogram, identifying at least a time portion of said time-domain reflectogram comprising at least one amplitude peak corresponding to a propagation inhomogeneity, subtracting the identified time portion of the reflectogram, divided by the signal reflection coefficient at the injection point, from the test signal, and replacing the test signal with the result of the subtraction.

According to a particular aspect of the invention, the identified time portion of said time-domain reflectogram comprises a single amplitude peak, corresponding to the first propagation inhomogeneity identified in said time-domain reflectogram.

According to a particular aspect of the invention, the identified time portion of said time-domain reflectogram is equal to the whole of said time-domain reflectogram.

According to a particular aspect of the invention, the number of iterations is configured to attenuate the amplitude peaks corresponding to the propagation inhomogeneities at a given threshold in the test signal.

According to a particular aspect of the invention, the number of iterations is configured in such a way that the amplitude peaks corresponding to the propagation inhomogeneities are pushed back to a given time-domain distance, in said time-domain reflectogram, from the amplitude peak corresponding to the injection point.

According to a particular aspect of the invention, the test signal injected in the first iteration is a Gaussian signal.

The invention also proposes a reflectometry system comprising means suitable for executing the reflectometry method according to the invention.

BRIEF DESCRIPTION OF THE DRAWINGS

Other characteristics and advantages of the present invention will become more apparent in the light of the following description, relating to the attached drawings, which show.

DETAILED DESCRIPTION

Figure 1:
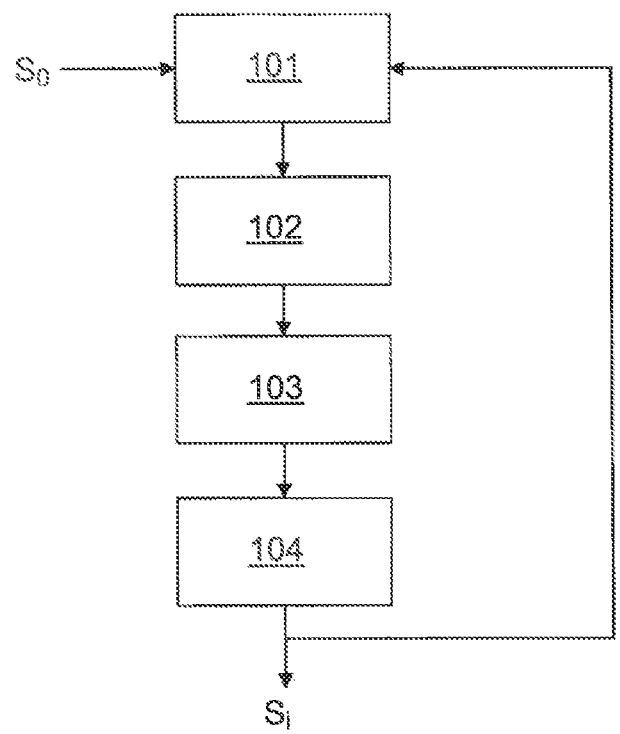
in FIG. 1, a flow diagram of the steps of execution of the method according to the invention, in FIGS. 2a, 2b, 2c, three timing diagrams showing, respectively, an example of a time-domain reflectogram exhibiting inhomogeneities, the optimal test signal produced by using the method according to the invention, and the time-domain reflectogram obtained by injecting said optimal test signal, in FIG. 3, a synoptic diagram of a reflectometry system comprising means suitable for executing the method according to the invention.

FIG. 1 shows schematically, in a flow diagram, the steps of the execution of the method according to the invention.

The basic principle of the invention is that of sequentially canceling the signals in the measured reflectogram corresponding to propagation inhomogeneities. These signals are canceled iteratively, resulting in the formation of a modified test signal adapted to the characteristics of the cable to be tested.

In a first step 101, a test signal $S_0$ is injected into a cable. This test signal may be a Gaussian signal, that is to say a pulse of Gaussian form or any other signal compatible with a time-domain reflectometry method.

In a second step 102, the reflection of the test signal is measured in order to produce a first time-domain reflectogram. This reflectogram contains a plurality of amplitude peaks, the first of these peaks corresponding to the point of injection of the test signal into the cable, and the last of these peaks corresponding to an evident fault, for example a cable end or a short circuit, or an electrical load. The reflectogram also contains a plurality of peaks of lower amplitude, corresponding to the propagation inhomogeneities.

In a third step 103, a time portion of the measured reflectogram is identified, comprising at least one amplitude peak to be canceled or compensated. According to a first embodiment, this time portion may correspond to the first peak, along the time axis of the reflectogram, that is to be compensated. According to a second embodiment, this time portion may also comprise a plurality of peaks to be compensated, or may be equal to the whole of the measured reflectogram.

In a fourth step 104, the time portion identified in step 103 is weighted with an estimate of the reflection coefficient of the signal at the point of injection into the cable, and is then subtracted from the test signal in order to form a modified test signal $S_1$. The applied weighting consists in a division by an estimate of the reflection coefficient.

Steps 101 to 104 are then iterated several times so as to modify the test signal successively until a final modified test signal $S_i$ is obtained, this signal being adapted to the characteristics of the cable.

When this final modified test signal $S_i$ has been constructed, it can be used by any known method of time-domain reflectometry to detect, locate, or generally characterize evident or non-evident faults that will affect the cable in future.

Because of the compensation of phenomena due to propagation inhomogeneities, the reflectogram measured by using the modified test signal according to the invention is free of parasitic peaks, and will now only contain amplitude peaks corresponding to faults that are to be identified.

The number of iterations performed is a parameter of the method. It is configured so as to attenuate the amplitude of the peaks that are to be compensated below a given threshold value. It can also be configured so as to push back the peaks to be compensated to a certain distance from the peak corresponding to the injection point, for example beyond the peak corresponding to the cable termination or beyond the cable portion to be tested.

Figure 2A:
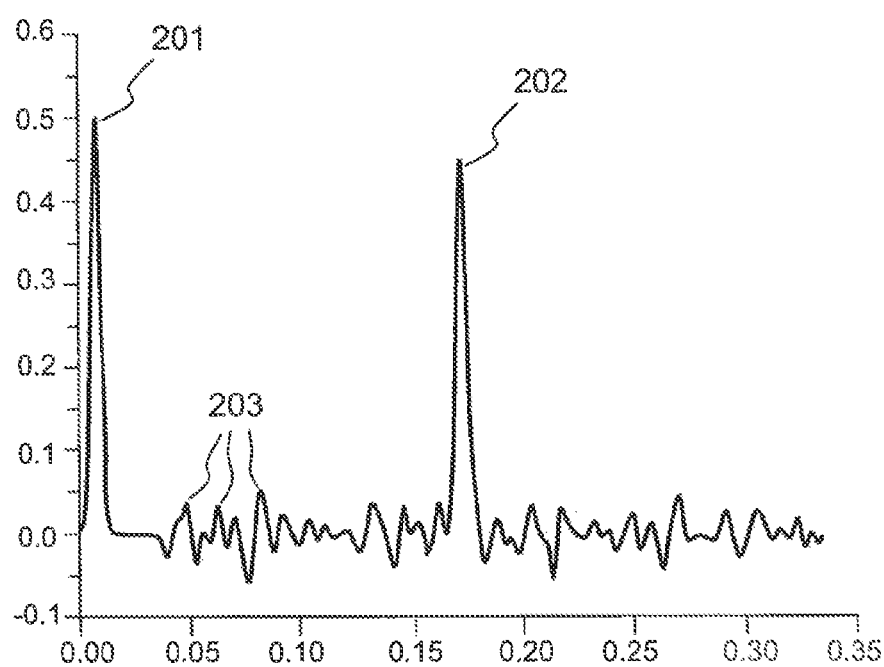
Figure 2B:
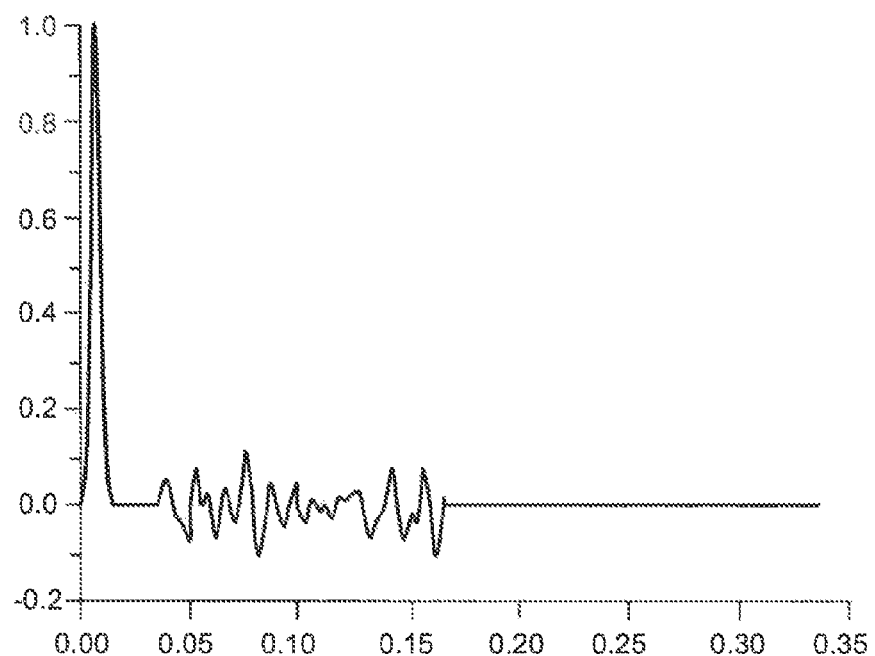
Figure 2C:
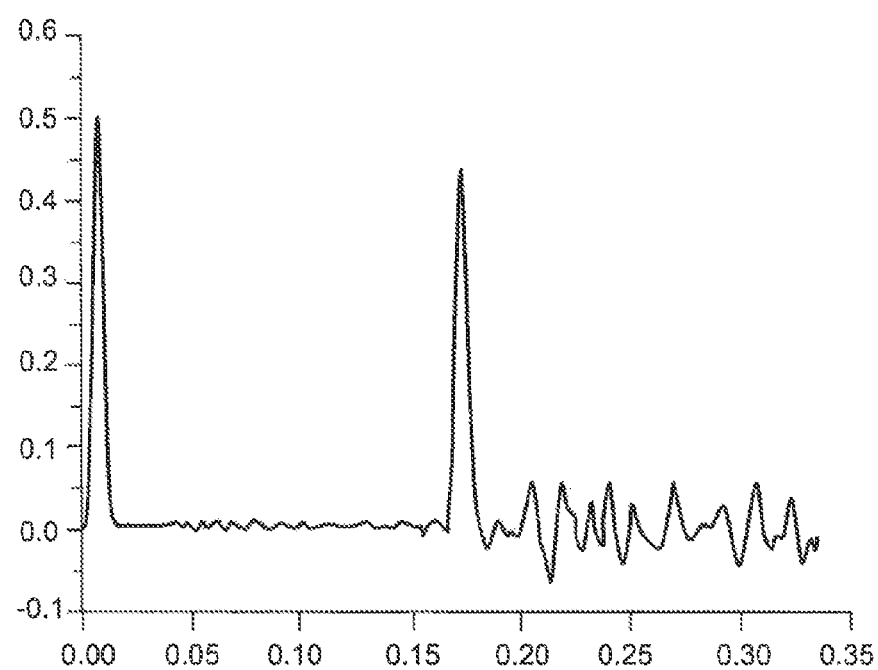

FIGS. 2a, 2b, 2c show the operation of the method according to the invention, in three timing diagrams.

FIG. 2a shows the time-domain reflectogram obtained at step 102 of the 1st iteration of the method, in other words the initial reflectogram. This reflectogram comprises a first peak 201 corresponding to the injection point of the test signal, which in this case is a Gaussian signal; a second peak 202 corresponding to the termination of the cable from which the signal is reflected, and a plurality of secondary peaks 203 corresponding to the propagation inhomogeneities.

FIG. 2b shows the modified test signal $S_i$ at the end of the execution of the method according to the invention.

FIG. 2c shows the time-domain reflectogram obtained by injecting the modified test signal $S_i$ shown in FIG. 2b into the cable.

It can be seen that the secondary peaks 203 are greatly attenuated between the injection point 201 and the termination of the cable 202.

The method according to the invention can be applied more generally for compensating for any undesired amplitude peak in a time-domain reflectogram. For example, in the case of an electricity line formed by two cable sections linked to one another by an interface, a mismatch peak between the two sections is present in the initial reflectogram. This peak can be compensated in the same way as the peaks due to propagation inhomogeneities, by using the method according to the invention.

Figure 3:
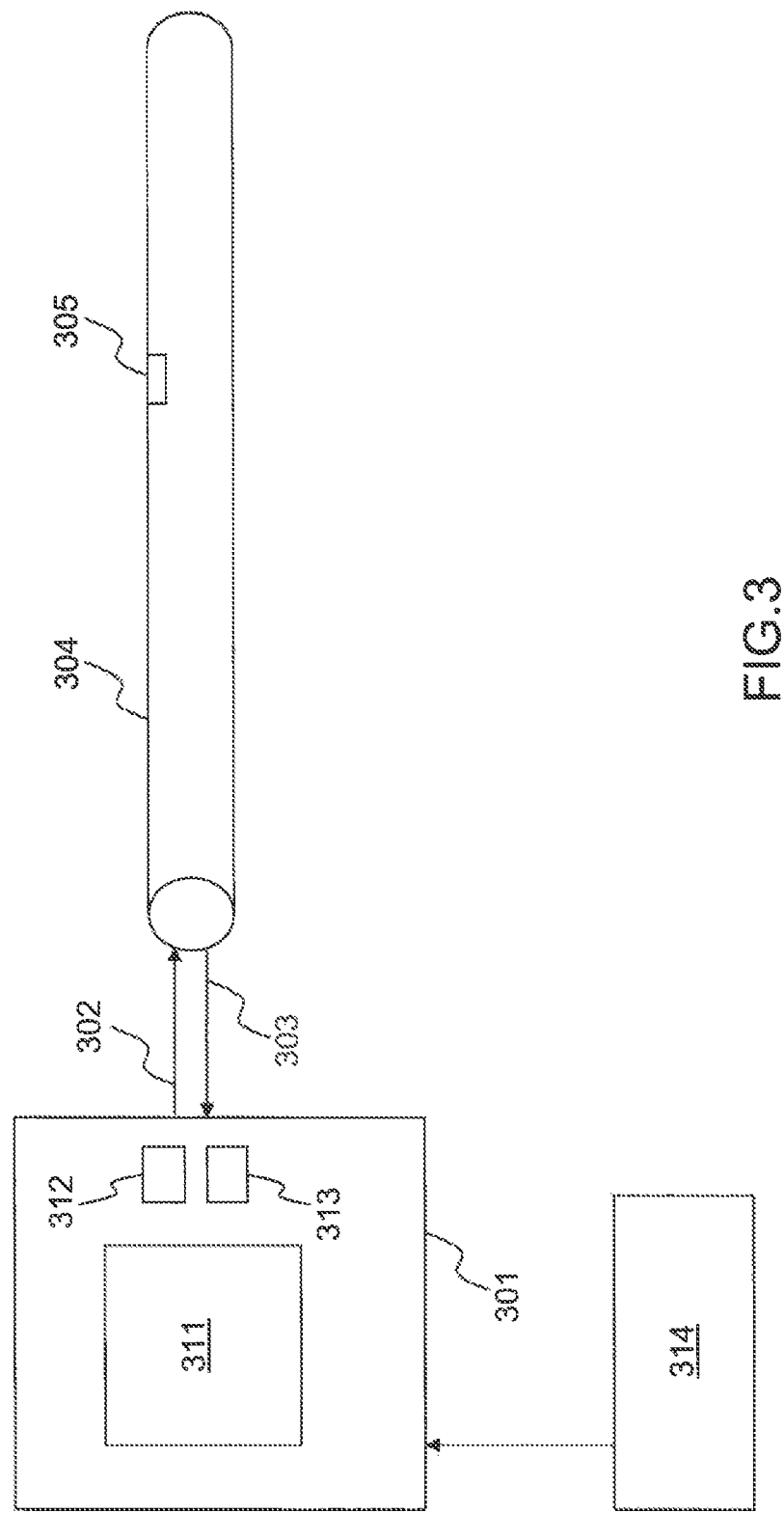

FIG. 3 provides a synoptic diagram of an example of a reflectometry system according to the invention.

A cable to be tested 304 has a fault 305 at any distance from an end of the cable.

The reflectometry system 301 according to the invention comprises an electronic component 311 of the integrated circuit type, such as a programmable logic circuit, for example an FPGA or microcontroller, adapted to provide two functions. On the one hand, the component 311 can be used to generate a reflectometry signal s(t) to be injected into the cable 304 being tested. The reflectometry signal s(t) is determined by the iterative method depicted in FIG. 1. This digitally generated signal is then converted by a digital-analog converter 312, and then injected 302 into an end 306 of the cable. The signal s(t) is propagated in the cable and is reflected from the singularity caused by the fault 305. The reflected signal is back-propagated to the injection point 306 and then captured 303, digitally converted by means of an analog-digital converter 313, and transmitted to the component 311. The electronic component 311 is also adapted to execute the steps of the method according to the invention described above in order to produce, from the received signal s(t), a time-domain reflectogram which can be transmitted to a processing unit 314, such as a computer, personal digital assistant or other device, in order to display the measurement results on a human-machine interface. The measured time-domain reflectogram is also used to modify the test signal s(t) so as to produce an optimal signal for suppressing the propagation inhomogeneities in the time-domain reflectogram measured in the course of a further iteration.

The system 301 depicted in FIG. 1 is a non-limiting exemplary embodiment. In particular, the two functions provided by the component 311 can be separated between two distinct components or devices. The system can also operate with analog signals, in which case the analog-digital and digital-analog converters are unnecessary. Instead of injecting and/or measuring the reflected signal at one end of the cable being tested, it is also possible to inject or measure the reflected signal at any point of the cable.

The reflectometry system according to the invention can also consist of a portable apparatus such as a tablet computer or smartphone, coupled to means for connection to a cable.

The method according to the invention to be used can be implemented, in the electronic component 311, by using hardware and/or software elements. It can, notably, be used as a computer program including instructions for its execution. The computer program may be recorded on a processor-readable recording medium.

The invention claimed is:

1. A method for compensating for propagation inhomogeneities in a time-domain reflectogram measured for a given cable, comprising the following steps, executed iteratively:
    injecting a test signal into the cable,
    measuring a reflection of the test signal to produce a time-domain reflectogram,
    performing with an electronic component the steps of:
    identifying at least one time portion of the time-domain reflectogram comprising at least one amplitude peak corresponding to a propagation inhomogeneity,
    subtracting the identified time portion of the reflectogram, divided by a signal reflection coefficient at the injection point from the test signal to produce a corrected test signal,
    replacing the test signal with the corrected test signal at a next iteration, and
    the method further comprising a final step of analyzing the time-domain reflectogram to characterize faults affecting the cable.

2. The method for compensating for the propagation inhomogeneities of claim 1, wherein the identified time portion of said time-domain reflectogram comprises a single amplitude peak, corresponding to the first propagation inhomogeneity identified in said time-domain reflectogram.

3. The method for compensating for the propagation inhomogeneities of claim 1, wherein the identified time portion of said time-domain reflectogram is equal to the whole of said time-domain reflectogram.

4. The method for compensating for the propagation inhomogeneities of claim 1, wherein a number of iterations of the steps of the method is configured to attenuate the amplitude peaks corresponding to the propagation inhomogeneities at a given threshold in the test signal.

5. The method for compensating for the propagation inhomogeneities of claim 1, wherein a number of iterations of the steps of the method is configured in such a way that the amplitude peaks corresponding to the propagation inhomogeneities are pushed back to a given time-domain distance, in said time-domain reflectogram, from an amplitude peak corresponding to the injection point.

6. The method for compensating for the propagation inhomogeneities of claim 1, wherein the test signal injected at a first iteration of the steps of the method is a Gaussian signal.

7. A reflectometry system for compensating for propagation inhomogeneities in a time-domain reflectogram measured for a given cable comprising:
    a first device configured for injecting a test signal into a cable; and
    a second device configured for:
    measuring a reflection of the test signal to produce a time-domain reflectogram,
    identifying at least one time portion of the time-domain reflectogram comprising at least one amplitude peak corresponding to a propagation inhomogeneity,
    subtracting the identified time portion of the reflectogram, divided by a signal reflection coefficient at the injection point from the test signal to produce a corrected test signal, and
    replacing the test signal with the corrected test signal, the reflectometry system being further configured for analyzing the time-domain reflectogram to characterize faults affecting the cable.

8. The reflectometry system for compensating for the propagation inhomogeneities of claim 7, wherein the identified time portion of said time-domain reflectogram comprises a single amplitude peak, corresponding to the first propagation inhomogeneity identified in said time-domain reflectogram.

9. The reflectometry system for compensating for the propagation inhomogeneities of claim 7, wherein the identified time portion of said time-domain reflectogram is equal to the whole of said time-domain reflectogram.

10. The reflectometry system for compensating for the propagation inhomogeneities of claim 7, wherein at least one of the devices is configured to implement a number of iterations to attenuate the amplitude peaks corresponding to the propagation inhomogeneities at a given threshold in the test signal.

11. The reflectometry system for compensating for the propagation inhomogeneities of claim 7, wherein at least one of the devices is configured to implement a number of iterations in such a way that the amplitude peaks corresponding to the propagation inhomogeneities are pushed back to a given time-domain distance, in said time-domain reflectogram, from an amplitude peak corresponding to the injection point.

12. The reflectometry system for compensating for the propagation inhomogeneities of claim 7, wherein the test signal injected at a first iteration of the steps of the method is a Gaussian signal.

13. The reflectometry system for compensating for the propagation inhomogeneities of claim 7 further comprising a human machine interface configured to output an analysis of the time-domain reflectogram that characterizes the faults affecting the cable.

14. The method for compensating for the propagation inhomogeneities of claim 1, further comprising outputting on a human machine interface an analysis of the time-domain reflectogram that characterizes the faults affecting the cable.

* * * * *